(12) United States Patent
Nguyen et al.

(10) Patent No.: US 7,153,542 B2
(45) Date of Patent: Dec. 26, 2006

(54) ASSEMBLY LINE PROCESSING METHOD

(75) Inventors: Tue Nguyen, Fremont, CA (US); Tai Dung Nguyen, Fremont, CA (US); Craig Alan Bercaw, Los Gatos, CA (US)

(73) Assignee: Tegal Corporation, Petaluma, CA (US)

( * ) Notice: Subject to any disclaimer, the term of this patent is extended or adjusted under 35 U.S.C. 154(b) by 296 days.

(21) Appl. No.: 10/212,546

(22) Filed: Aug. 6, 2002

(65) Prior Publication Data
US 2004/0026374 A1 Feb. 12, 2004

(51) Int. Cl.
*B05D 1/38* (2006.01)
*C23C 16/44* (2006.01)
*C23C 16/458* (2006.01)
*C23C 16/52* (2006.01)
*C23C 14/54* (2006.01)
*C23C 16/56* (2006.01)

(52) U.S. Cl. .............. 427/248.1; 427/569; 427/255.28; 427/402; 204/192.12; 118/719; 118/730; 118/733

(58) Field of Classification Search ................ 427/592, 427/593, 594, 226, 248, 1, 252, 253, 255.15, 427/255.26, 255.28, 255.4, 255.7, 422, 402, 427/419.2; 118/719, 724, 725; 438/689, 438/758, 761, 762, 763, 764; 216/59–81
See application file for complete search history.

(56) References Cited

U.S. PATENT DOCUMENTS

| | | | |
|---|---|---|---|
| 3,921,788 A | 11/1975 | Robertson, Jr. et al. ...... 198/19 |
| 4,030,622 A | 6/1977 | Brooks et al. ................. 214/17 |
| 4,058,430 A * | 11/1977 | Suntola et al. ......... 427/255.13 |
| 4,895,107 A | 1/1990 | Yano et al. ................. 118/722 |
| 5,180,434 A | 1/1993 | DiDio et al. ................. 118/718 |
| 5,223,001 A | 6/1993 | Saeki .......................... 29/25.01 |
| 5,223,112 A | 6/1993 | Tepman .................. 204/298.11 |
| 5,382,339 A | 1/1995 | Aranovich ............. 204/192.12 |
| 5,468,341 A | 11/1995 | Samukawa |
| 5,624,536 A | 4/1997 | Wada et al. ............ 204/298.11 |
| 5,648,728 A | 7/1997 | Canella ....................... 324/755 |
| 5,667,592 A | 9/1997 | Boitnott et al. ............. 118/719 |
| 5,672,239 A | 9/1997 | DeOrnellas ............. 156/625.1 |
| 5,855,679 A | 1/1999 | Ogawa ....................... 118/719 |
| 5,916,365 A | 6/1999 | Sherman |
| 5,951,770 A | 9/1999 | Perlov et al. ................ 118/719 |
| 5,968,587 A | 10/1999 | Frankel ........................ 427/8 |
| 6,200,893 B1 | 3/2001 | Sneh |
| 6,541,353 B1 * | 4/2003 | Sandhu et al. .............. 438/478 |
| 6,605,319 B1 | 8/2003 | Chinn et al. ........... 427/255.28 |
| 6,634,314 B1 * | 10/2003 | Hwang et al. ........... 118/723 R |
| 6,730,367 B1 * | 5/2004 | Sandhu ........................ 427/553 |
| 6,756,318 B1 * | 6/2004 | Nguyen et al. ............. 438/758 |
| 6,797,340 B1 * | 9/2004 | Fang et al. ................. 427/585 |
| 6,821,563 B1 * | 11/2004 | Yudovsky ................ 427/248.1 |
| 6,858,085 B1 * | 2/2005 | Nguyen et al. ............. 118/719 |
| 6,861,094 B1 * | 3/2005 | Derderian et al. ....... 427/248.1 |
| 6,869,641 B1 * | 3/2005 | Schmitt ................... 427/248.1 |
| 6,932,871 B1 * | 8/2005 | Chang et al. ............... 118/719 |
| 6,972,055 B1 * | 12/2005 | Sferlazzo .................... 118/719 |

(Continued)

*Primary Examiner*—Marianne Padgett
(74) *Attorney, Agent, or Firm*—Fliesler, Meyer LLP

(57) ABSTRACT

An apparatus for sequential processing of a workpiece comprises an assembly line processing system. The apparatus comprises multiple workpieces moving in an assembly line fashion under multiple process stations. The multiple process stations provide different processes onto the workpieces for a sequential processing of the workpieces. The sequential processing action is carried out by the movement of the workpieces under the various process stations.

27 Claims, 13 Drawing Sheets

U.S. PATENT DOCUMENTS

| | | | |
|---|---|---|---|
| 7,020,981 B1* | 4/2006 | Shero et al. | 34/366 |
| 7,087,119 B1* | 8/2006 | Sandhu | 118/715 |
| 2001/0007244 A1* | 7/2001 | Matsuse | 118/719 |
| 2002/0100418 A1* | 8/2002 | Sandhu et al. | 118/719 |
| 2002/0102818 A1* | 8/2002 | Sandhu et al. | 438/479 |
| 2003/0194493 A1* | 10/2003 | Chang et al. | 427/248.1 |
| 2004/0067641 A1* | 4/2004 | Yudovsky | 438/680 |
| 2004/0185184 A1* | 9/2004 | Sandhu | 427/586 |
| 2004/0187784 A1* | 9/2004 | Sferlazzo | 118/719 |
| 2005/0084610 A1* | 4/2005 | Selitser | 427/248.1 |
| 2005/0116064 A1* | 6/2005 | Basceri et al. | 239/419 |
| 2005/0247265 A1* | 11/2005 | Devine et al. | 118/719 |
| 2005/0271814 A1* | 12/2005 | Chang et al. | 427/248.1 |
| 2006/0046412 A1* | 3/2006 | Nguyen et al. | 438/337 |
| 2006/0073276 A1* | 4/2006 | Antonissen | 427/248.1 |
| 2006/0134345 A1* | 6/2006 | Rueger et al. | 427/569 |
| 2006/0177579 A1* | 8/2006 | Shin et al. | 427/248.1 |

* cited by examiner (a)

(b)

ASSEMBLY LINE PROCESSING METHOD

BACKGROUND

The present invention relates to sequential thin film processing.

The fabrication of modern semiconductor workpiece structures has traditionally relied on plasma processing in a variety of operations such as etching and deposition. Plasma etching involves using chemically active atoms or energetic ions to remove material from a substrate. Deposition techniques employing plasma include Chemical Vapor Deposition (CVD) and Physical Vapor Deposition (PVD) or sputtering. PVD uses a high vacuum apparatus and generated plasma that sputters atoms or clusters of atoms toward the surface of the wafer substrates. PVD is a line of sight deposition process that is more difficult to achieve conformal film deposition over complex topography such as deposition of a thin and uniform liner or barrier layer over the small trench or via of 0.13 µm or less, especially with high aspect ratio greater than 4:1. Plasma generation methods include parallel plate plasma, inductive coupled plasma (ICP), remote plasma, microwave plasma. In parallel plate plasma, a power source is applied across two parallel plates to create an electric field which will ionize the gas to generate the plasma. The plasma is confined between the parallel plates where the electric field is strongest, and there is significant plasma bombardment due to the presence of the electric field. In inductive coupled plasma, a power source is applied to a coil to create a magnetic field which will ionize the gas to generate the plasma. A non-conducting window such as ceramic plate could be used to separate the plasma source from the plasma. Care should be taken so that no metal is deposited on the non-conducting window, otherwise the deposited metal will block the magnetic field, and the plasma will be extinguished. This is the reason why inductive coupled plasma was not used for metal deposition. Typical parallel plate plasma and inductive coupled plasma use radio frequency (RF) power sources. In remote plasma, a plasma is generated elsewhere and then being brought to the process chamber. In microwave plasma, the plasma uses microwave frequency (MW) power source. Microwave plasma tends to be remote plasma, and is brought to the process chamber using microwave guide. Plasma processing can be used for sputtering thin film deposition, such as metal sputtering or dielectric sputtering. Plasma processing can be used for plasma etching.

In CVD processing, a gas or vapor mixture is flowed over the wafer surface that is kept at an elevated temperature. Reactions then take place at the hot surface where deposition takes place. Temperature of the wafer surface is an important factor in CVD deposition, as it depends on the chemistry of the precursor for deposition and affects the uniformity of deposition over the large wafer surface. CVD typically requires high temperature for deposition which may not be compatible with other processes in the semiconductor process. CVD at lower temperature tends to produce low quality films in terms of uniformity and impurities.

In a deposition technology similar to the CVD technique, known as atomic layer deposition ("ALD"), various gases are injected into the chamber for as short as 100–500 milliseconds in alternating sequences. For example, a first gas is delivered into the chamber for about 500 milliseconds and the substrate is heated, then the first gas (heat optional) is turned off. The residue from the first gas is then evacuated. Another gas is delivered into the chamber for another 500 milliseconds (heat optional). The residue from this gas is also evacuated before the next gas is delivered for about 500 milliseconds (and optionally heated). This sequence is done until all gases have been cycled through the chamber. Each gas sequence typically forms a monolayer which is highly conformal. ALD technology thus pulses gas injection and heating sequences that are between 100 and 500 milliseconds. This approach has a high dissociation energy requirement to break the bonds in the various precursor gases, such as silane and oxygen, and thus requires the substrate to be heated to a high temperature, for example on the order of 600–800 degrees Celsius for silane and oxygen processes.

ALD also uses radical generators, such as plasma generators, to increase the reactivity of the second gas and effectively the reaction between the first and the second gases at the substrate. U.S. Pat. No. 5,916,365 to Sherman entitled "Sequential chemical vapor deposition" provides for sequential chemical vapor deposition by employing a reactor operated at low pressure, a pump to remove excess reactants, and a line to introduce gas into the reactor through a valve. Sherman exposes the part to a gaseous first reactant, including a non-semiconductor element of the thin film to be formed, wherein the first reactant adsorbs on the part. The Sherman process produces sub-monolayer per gas injection due to adsorption. The first reactant forms a monolayer on the part to be coated (after multiple cycles), while the second reactant passes through a radical generator which partially decomposes or activates the second reactant into a gaseous radical before it impinges on the monolayer. This second reactant does not necessarily form a monolayer but is available to react with the deposited monolayer. A pump removes the excess second reactant and reaction products completing the process cycle. The process cycle can be repeated to grow the desired thickness of film.

There are other applications using plasma in the ALD process. U.S. Pat. No. 6,200,893 to Sneh, entitled, "Radical-assisted sequential CVD" discusses a method for CVD on a substrate wherein radical species are used in alternate steps for depositions from a molecular precursor to treat the material deposited from the molecular precursor, and to prepare the substrate surface with a reactive chemical in preparation for the next molecular precursor step. By repetitive cycles, a composite integrated film is produced. In a preferred embodiment, the depositions from the molecular precursor are metals, and the radicals in the alternate steps are used to remove the ligands left from the metal precursor reactions, and to oxidize or nitride the metal surface in subsequent layers.

In one embodiment taught by Sneh, a metal is deposited on a substrate surface in a deposition chamber by (a) depositing a monolayer of metal on the substrate surface by flowing a molecular precursor gas or vapor bearing the metal over a surface of the substrate, the surface saturated by a first reactive species with which the precursor will react by depositing the metal and forming reaction product, leaving a metal surface covered with ligands from the metal precursor and therefore not further reactive with the precursor; (b) terminating flow of the precursor gas or vapor; (c) purging the precursor with an inert gas; (d) flowing at least one radical species into the chamber and over the surface, the radical species is highly reactive with the surface ligands of the metal precursor layer and eliminates the ligands as reaction product, and saturates the surface, providing the first reactive species; and (e) repeating the steps in order until a metallic film of desired thickness results.

In another Sneh aspect, a metal nitride is deposited on a substrate surface in a deposition chamber by (a) depositing a monolayer of metal on the substrate surface by flowing a metal precursor gas or vapor bearing the metal over a surface of the substrate, the surface saturated by a first reactive species with which the precursor will react by depositing the metal and forming reaction product, leaving a metal surface covered with ligands from the metal precursor and therefore not further reactive with the precursor; (b) terminating flow of the precursor gas or vapor; (c) purging the precursor with inert gas; (d) flowing a first radical species into the chamber and over the surface, the atomic species highly reactive with the surface ligands of the metal precursor layer and eliminating the ligands as reaction product and also saturating the surface; (e) flowing radical nitrogen into the chamber to combine with the metal monolayer deposited in step (a), forming a nitride of the metal; (f) flowing a third radical species into the chamber terminating the surface with the first reactive species in preparation for a next metal deposition step; and (g) repeating the steps in order until a composite film of desired thickness results.

The Sneh embodiments thus deposit monolayers, one at a time. This process is relatively time-consuming as a thick film is desired.

Another application of sequential deposition is nanolayer thick film deposition ("NLD"), U.S. patent application Ser. No. 09/954,244, filed on Sep. 10, 2001 by the same inventors, Tue Nguyen et al. NLD is a process of depositing a thin film by chemical vapor deposition, including the steps of evacuating a chamber of gases, exposing a workpiece to a gaseous first reactant, wherein the first reactant deposits on the workpiece to form the thin film, then evacuating the chamber of gases, and exposing the workpiece, coated with the first reactant, to a gaseous second reactant under plasma, wherein the thin film deposited by the first reactant is treated to form the same materials or a different material.

In comparison with CVD, atomic layer deposition ("ALD" or "ALCVD") is a modified CVD process that is temperature-sensitive and flux-independent. ALD is based on self-limiting surface reaction. ALD provides a uniform deposition over complex topography and is temperature-independent, since the gases are adsorbed onto the surface at lower a temperature than CVD because it is an adsorption regime.

As discussed in Sherman and Sneh, the ALD process includes cycles of flowing gas reactant into the chamber, adsorbing one sub-monolayer onto the wafer surface, purging the gas reactant, flowing a second gas reactant into the chamber, and reacting the second gas reactant with the first gas reactant to form a monolayer on the wafer substrate. Thick film is achieved by deposition of multiple cycles.

Precise thickness can be controlled by the number of cycles, since a monolayer is deposited per cycle. However, the conventional ALD method is slow in depositing films, such as those around 100 Å in thickness. The growth rate of ALD TiN, for example, was reported at 0.2 Å/cycle, which is typical of metal nitrides from corresponding chlorides and $NH_3$.

The throughput in workpiece fabrication for a conventional ALD system is slow. Even if the chamber is designed with minimal volume, the throughput is still slow due to the large number of cycles required to achieve the thickness. The pump/purge cycle between gases is very time consuming, especially with liquid or solid vapors. Conventional ALD is a slower process than CVD with a rate of deposition almost 10 times as slow as CVD deposition. The process is also chemical dependent to have the proper self-limiting surface reaction for deposition. To improve the throughput, a batch system has been developed to process many wafers at the same time.

As with other sequential processing methods, the precursor gases or vapors are introduced sequentially with a pump/purge step in between to ensure the complete removal of the precursor. This pump/purge step does not contribute to the film process. Therefore, it would be advantageous to eliminate this step from the processing sequence.

SUMMARY

Accordingly, an assembly line processing system apparatus for assembly-line style sequential processing method is disclosed.

In a co-pending application by the same authors, Tue Nguyen et al., entitled "Assembly line processing system," Ser. No. 10/212,545, filed Aug. 6, 2002, an assembly line processing system apparatus is disclosed, having much improved throughput compared with an apparatus processing only one workpiece. The invention discloses an apparatus with similar throughput as a batch apparatus which can process many workpieces at the same time. However, the invention uses an assembly line technique to process many workpieces, sequentially, not all at the same time as in a batch system. With the assembly line technique, the workpiece is processed sequentially when it moved through the assembly line. The on/off cycle of the precursors employed in typical sequential systems is not needed in the present invention assembly line system.

One aspect of the invention assembly line system apparatus is the sequential processing of a workpiece without the pulsing of the flow of the precursors. The workpieces are positioned on a movable workpiece conveyor, which comprises multiple workpiece supports, each adapted to carry a workpiece. The movable workpiece conveyor is capable of continuously and repeatedly running in a closed-loop path, therefore each workpiece passes the same position a number of times. There are at least two process stations positioned along the closed-loop path of the workpiece conveyor to provide two different processes to the workpieces. With the two process stations providing different processes to each workpiece, each workpiece is processed sequentially in an assembly line fashion, from the first process station, and then from the second process station, when the conveyor is moving one cycle along the closed-loop path. By repeatedly moving the conveyor along the closed-loop path with the process station under operating conditions, the workpieces positioned on the conveyor are processed through a plurality of cycles, with each cycle defined by the sequential processes of the different process stations.

The process station delivers a plurality of precursors onto the workpieces. For examples sequential processing may comprise the first process station providing the trimethyl aluminum ("TMA") vapor as a precursor. TMA precursor adsorbs onto the surface of the workpiece when the workpiece passes by the first process station. The second process station provides ozone vapor as a precursor. When the workpiece passes by the second process station, the ozone precursor reacts with the TMA adsorbed on the surface of the workpiece to form a thin film of aluminum oxide on the workpiece. By repeatedly moving the workpiece, multiple layers of aluminum oxide are formed on the workpiece. The thickness of the aluminum oxide thin film is controlled by the number of cycles of the workpiece through the process stations. The flow of the TMA and ozone precursors can be continuous, and need not be pulsed as with ALD processing. The moving of the conveyor exposes the workpiece sequentially to the TMA precursor and then to the ozone precursor, and then back to the TMA precursor.

A typical assembly line sequential deposition comprises the following steps:

a) A number of workpieces are loaded onto the workpiece conveyor. The workpieces are positioned on the workpiece supports. There might be empty positions on the workpiece conveyor, e.g., each workpiece support does not necessarily have a workpiece.
b) The first process station is turned on.
c) The conveyor moves to process the workpieces under the first process station.
d) When the workpieces, already processed under the first station, reach the second process station, the second process station is turned on. This operation offset of the second process station at the beginning of the process sequence ensures that all the workpieces have the same process sequence.
e) The conveyor moves a number of cycles. The number of cycles determines the thickness of the thin film to be deposited.
f) The first process station is turned off before the second process station. This operation offset of the first process station at the end of the process sequence ensures that all the workpieces have the same process sequence.
g) The second process station is turned off.
h) The conveyor stops and all the workpieces are unloaded from the conveyor.

The sequential processing of the workpieces in the present invention assembly line processing system does not fequifed require the process flows of the process stations to be interrupted. The sequential processing is performed by the assembly line action.

The processing of the workpiece can be a deposition of a thin film, or an adsorption of a sub-monolayer of a plurality of precursors or reactants, or an etching of a thin layer, or a reaction, with or without an exciting source such as a plasma source, of a plurality of precursors or reactants onto the existing layers on the workpiece.

Implementations of the above aspect may include one or more of the following.

The workpiece can be a semiconductor wafer. While the present invention is perfectly suitable for semiconductor processing, it also can be used for processing in other fields, such as hardness coating for tools, chamber coating for modifying chamber surface characteristics.

The process station can deliver the precursors from the side of the workpiece, or from the top of the workpiece. The outlets for the precursor flows from the process station can be a round injector, a linear injectors or a showerhead injector. Since the workpiece is moving, a linear injector perpendicular to the direction of movement is adequate to ensure uniform distribution of the precursors onto the workpiece. A showerhead injector can be oblong and still provide the same uniform flow distribution as a round showerhead because of the movement of the workpiece.

The apparatus can further comprise a plurality of isolation stations positioned between the process stations to minimize cross contamination between the process stations. The precursors from the process stations react together at the workpiece surface, but it is desirable to keep these precursors separate as not to create possible gas phase reaction, causing particles, or deposition on unwanted surfaces such as chamber walls. The isolation station can comprise a plurality of pumping systems, to remove the precursors from the surrounding process stations. The isolation station can comprise a plurality of purging systems, to provide non-reactive gas, such as an inert gas, between the surrounding process stations to create a gas curtain for isolation purpose.

The isolation station can comprise a purging system between the surrounding two process stations, together with two pumping systems between the process station and the purging system to improve the isolation between the process stations. The isolation station can surround the process station to capture the precursor flows from the process station in all directions.

The workpiece support can be recessed to create a cavity. The cavity captures the precursors from one process station and carries the precursors along the conveyor path to increase the retention time of the precursors to the workpiece. This cavity design will need a pump/purge system to prevent the precursors from moving from one process station to the other process station. The workpiece support can be flushed with the workpiece exposed. This design will not extend the retention time of the precursors when the workpiece is moving from one process station to the other process station, but the need for pump/purge system to prevent cross contamination is much reduced.

The apparatus can be processed in sub-atmospheric pressure. The movable conveyor can be covered by an enclosed chamber connected to a vacuum pump system, to maintain the enclosed chamber at a sub-atmospheric pressure. The vacuum pump system can also be used as an isolation station. The enclosed chamber can have a throttle valve to regulate the pressure in the chamber.

The movable workpiece conveyor can be a conveyor belt to move the workpieces along a closed-loop path. The conveyor can be a rotatable platform, rotated with respect to an axis at the center of the platform.

The apparatus can further comprise a plurality of load-or-unload stations, to load or unload the workpiece between the load-or-unload stations and the workpiece supports. The load-or-unload station can perform both loading and unloading actions, or only the loading action, or only the unloading action. In an aspect of the invention where the apparatus can be processed at sub-atmospheric pressure, the apparatus can further comprise an external pathway between the enclosed chamber and the load-or-unload stations. The external pathway also can comprise a gate valve for vacuum isolation.

The apparatus can further comprise a plurality of workpiece heaters coupled to the workpiece support. The workpiece heaters are capable of heating the workpiece to an elevated temperature. The workpiece heaters are a part of the process requirements. Some processes require that the workpiece be heated to an elevated temperature, while other processes can run at room temperature and other processes need to run below room temperature. The workpiece heater can be a radiative heater, such as a lamp, or a resistive heater.

The apparatus can further comprise a plurality of heating stations to provide thermal energy to the workpieces. Besides the workpiece heaters coupled to the workpiece support, the heating station is another way to heat the workpiece to an elevated temperature. The heating station can comprise a radiative heater such as a tungsten halogen lamp. The heating lamp can be a linear lamp, positioned perpendicular to the conveyor movement. Due to motion of the workpiece, a linear lamp can provide good uniform heating to the workpiece.

The apparatus can further comprise a plurality of laser stations to provide laser energy to the workpieces. Laser energy can promote the reaction between the precursors supplied to the workpieces. The laser station can comprise a linear laser beam positioned perpendicular to the conveyor movement. Due to motion of the workpiece, a linear laser beam can provide good uniform energy to the workpiece.

The apparatus can further comprise a plurality of workpiece lifts to separate the workpiece from the workpiece support. The workpiece lifts can be a 3-pin actuators to lift the workpiece. After the workpiece is separated from the workpiece support, a blade can be inserted under the workpiece to lift the workpiece up and remove the workpiece to a load-or-unload station.

The process station can comprises a plurality of delivery systems to provide a plurality of precursors onto the workpieces. The delivery systems are a part of the process requirements. The delivery system can be a gaseous delivery system where the precursors to be delivered onto the workpieces are stored in gaseous form. The delivery system can be a liquid precursor delivery system where the precursors are stored in liquid form and delivered onto the workpieces in vapor form. The liquid delivery system can be a bubbler system where the vapor is drawn from the liquid container, with or without the help of a bubbler. The liquid delivery system can be a liquid injection system where the liquid is drawn from the liquid container and then converted to vapor form using a vaporizer. The delivery system can be a solid precursor delivery system where the precursors are stored in solid form and delivered onto the workpieces in vapor form. The delivery system can comprise a vaporizer to vaporize a liquid precursor or a solid precursor. The delivery system can comprise a liquid flow controller to control the amount of liquid precursor flow. The delivery system can comprise a mass flow controller to control the amount of vapor precursor flow. The delivery system can comprise a number of valves to control the timing of the precursor delivery.

The apparatus can further comprise a plurality of plasma stations to provide plasma energy to the workpieces. Plasma energy can promote the reaction between the precursors supplied to the workpieces. The plasma can be used to excite the precursors, generate radical species, and increase the reaction rate. The plasma can be used for deposition processes, reaction processes, etching processes, or chamber clean processes. The plasma source can be an inductive coupled plasma source using radio frequency ("RF"). The plasma source can be a parallel plate plasma source using radio frequency. The plasma source can be a remote plasma source. The plasma source can be a microwave plasma source using microwave frequency ("MW").

The process stations can comprise a plurality of plasma generators to energize the precursors, excite the precursors, generate radical species, and increase the reaction rate.

The apparatus can further comprise a plurality of workpiece bias power sources coupled to the workpiece supports. The workpiece bias power source can be a direct current ("DC") bias source, or a RF bias source. The workpiece bias power source can provide a potential bias to the workpiece to modify the path of the charged precursors, to provide bombardment to the workpiece.

In a preferred embodiment, the present invention apparatus comprises an enclosed chamber being vacuum-tight to allow processing under sub-atmospheric pressure. The enclosed chamber covers a rotatable workpiece conveyor. The rotatable workpiece conveyor defines a closed-loop processing path and comprises multiple workpiece supports with each workpiece support adapted to carry a workpiece. The conveyor is capable of continuously and repeatedly moving the workpiece supports and the workpieces along the closed-loop processing path. The apparatus further comprises at least two process stations coupled to the enclosed chamber. The process stations are positioned along the closed-loop processing path to provide a process onto the workpieces when the workpieces pass through the process stations. The process stations delivery a plurality of precursors onto the workpieces. When the workpieces are moving along the closed-loop processing path, the process stations provide sequential processes onto the workpieces. The apparatus further comprises a motor system to move the rotatable workpiece conveyor along the closed-loop processing path. The apparatus further comprises a plurality of isolation stations. The isolation stations are positioned between the process stations to minimize cross-contamination between the process stations. The apparatus further comprises a plurality of load-or-unload stations to load or unload the workpieces onto the workpiece supports. Therefore by repeatedly moving the rotatable workpiece conveyor along the closed-loop processing path with the process stations under operating conditions, a plurality of workpieces positioned on the rotatable workpiece conveyor are processed in an assembly line fashion with the workpieces being processed sequentially by different process stations and the workpieces being processed a plurality of cycles by the closed-loop processing path.

The process station can comprise a deposition system to deposit a thin film on the workpiece such as CVD, ALD, plasma-enhanced CVD, metal organic CVD ("MOCVD"), or sputtering deposition. A sputtering deposition system can sputter deposit a thin film on the workpiece. A plasma-enhanced deposition can deposit a thin film on the workpiece. The process station can comprise a treatment system to treat an existing thin film on the workpiece such as rapid thermal annealing, laser annealing, plasma annealing, or desorption reaction. The process station can comprise an etching system for etching an existing thin film of the workpiece such as metal etch, oxide etch, or atomic layer etch. A plasma etch station can provide a plasma etch process to the workpiece. A combination of various stations can provide multiplayer sequential processing to a workpiece such as a sequence of deposition/etch/deposition/etch process to enhance the conformality, or to control the film property.

In a co-pending application by the same inventors, Tue Nguyen et al., entitled, "Assembly line processing method," Ser. No. 10/212,545, filed Aug. 6. 2002, a method of sequential processing of a workpiece is disclosed. The operating conditions for the assembly line processing system for sequential deposition of a multilayer are:

The workpieces positioned on the workpiece supports of the workpiece conveyor.

The process stations operating continuously.

The workpiece conveyor rotating continuously.

Under operating conditions, the workpieces are automatically processed sequentially, first by the first process station, then by the second process station, etc. until the last process station, and then the cycle is repeated.

The process stations are coupled to the workpiece supports as to provide a process to the workpiece when the workpiece supports pass by the process stations. The process stations are coupled to the workpiece supports, not to the workpieces, because the process stations are capable of delivering a process with or without the presence of the workpieces. Without the workpieces, the process stations will deliver the process onto the workpiece supports.

The process stations can operate continuously without interruption, or stop-and-go. In certain aspects, the process stations can operate in pulse mode, i.e., on and off. There might be some benefits to stopping the process stations when there are no workpieces to process. However, this condition is not necessary, and the on-off operation might present some disadvantages such as wear and tear, disruption of the flow, and/or changing in precursor concentration. In some aspects, the workpiece can be a semiconductor wafer.

To prevent cross-contamination, isolation stations can be positioned between the process stations to minimize precursor flow from one process station to another process station. The system can further comprise plasma stations to provide plasma energy; heating stations to provide thermal energy and photon energy, and/or laser stations to provide laser energy to the workpieces.

Plasma energy can also be provided through the process station by coupling the precursor flow with a plasma generator to excite and energize the precursors. Thermal energy can also be provided through resistive heaters coupled to the workpiece supports to heat the workpieces.

In addition to the basic steps of sequentially processing the workpieces, there are beginning and ending steps disclosed. In the beginning, the step of loading the workpieces onto the workpiece support of the workpiece conveyor is disclosed. In the end, the step of unloading the workpieces from the workpiece support is disclosed. In the beginning, the offsetting of the operation of the process stations is disclosed so that all workpieces have the same process sequence. The beginning step of offsetting the operation of the process stations is the delay start of subsequent process stations so that all workpieces are being processed first by the first process station. The ideal case is that the first process station is turned on and the workpieces start passing by the first process station to be processed. Then the second process station is turned on and the workpieces pass through the second process station to be processed, after being process by the first process station. Similarly, the third process station is turned on only after the workpieces have been processed by the first and second process stations. In many cases, the timing is not critical. For the case of ALD processing, for example, since the processing time and then number of processing the same step are not a critical variable (meaning that no matter how long and how often the workpiece being processed by the first station, the result is the same), the second station can be turned on right after the workpieces being processed by the first station, or the second station can be turned on after the conveyor makes a complete cycle, or even many cycles.

Similarly, in the end, the offsetting of the operation of the process stations is disclosed so that all workpieces have the same process sequence. The ending step of offsetting the operation of the process stations is the delay stop of subsequent process stations so that all workpieces are being processed last by the last process station. The ideal case is that the first process station is turned off and the workpieces start passing by the first process station without processed. Then the second process station is turned off and the workpieces pass through the second process station without being processed. Similar to the beginning offset operation, in many cases, the timing is not critical. For the case of ALD processing, for example, since the processing time and then number of processing the same step are not a critical variable, after the first station is turned off, the second station can be turned off right after the workpieces passed unprocessed by the first station, or the second station can be turned off after the conveyor makes a complete cycle, or even many cycles.

This sequential process method is different from the prior art sequential or ALD processing method in which the pump/purge step between the processing steps is replaced by a workpiece movement.

The workpiece processing by the first process station can comprise the deposition of a thin film. The characteristic of a deposition process is that the deposited film thickness increases noticeably as a function of processing time. The thin film deposition can occur by the introduction of appropriate precursors through a delivery system in the first compartment. By exposing the workpiece to appropriate precursors under appropriate conditions, a thin film can be deposited on the workpiece. The thickness of the deposited film can be from a monolayer to hundreds of nanometers, controllable by various process conditions, such as the process time. A workpiece heater in the first compartment can supply the energy needed for the deposition reaction to take place. The workpiece heater can be a radiative heater or a resistive heater. A plasma or a bias source can also be added to supply the energy needed, or to modify the process characteristics. The process pressure can be sub-atmospheric, controlled by a throttle valve connected to a vacuum pump. The process pressure can be atmospheric, depending on the processes.

The workpiece processing by the first process station can comprise the adsorption of a thin film. The characteristic of an adsorption process is that the adsorbed film thickness does not increase noticeably as a function of processing time. The adsorbed film saturates at a certain thickness, typically less than a monolayer, after a period of processing time. This adsorption characteristic of the ALD process ensures a very good conformality of the coated film and ensures a consistent thickness with a wide process margin. The thickness of the adsorbed film is typically less than a monolayer, and is much more difficult to control than the deposited film.

Implementations of the above aspect of the present invention may include one or more of the following. The workpiece can be a wafer. The plasma enhances or maintains the thin film conformality. The plasma can be a high density plasma with higher than $5 \times 10^9$ ion/cm$^3$. The reactant can be a metal organic, organic, to form a thin film of metal, metal nitride, or metal oxide. The second reactant can be exposed under high pressure above 100 mT. The first and second reactants can react and the reaction can create a new compound. The thin film thickness can be less than one atomic layer thickness. The thin film thickness can be greater than one atomic layer in thickness. The thin film thickness can be between a fraction of a nanometer and tens of nanometers. The plasma can be sequentially pulsed for each layer to be deposited. The plasma can be excited with a solid state RF plasma source, such as a helical ribbon electrode. The process can include pre-cleaning a surface of a workpiece; stabilizing precursor flow and pressure; exposing the workpiece to a first reactant in the first process station, wherein the first reactant deposits or is adsorbed onto the workpiece to form a thin film; transferring the workpiece to the second process station; striking the plasma; performing a plasma treatment on the deposited or adsorbed film; exposing the workpiece, coated with the first reactant, to a gaseous second reactant under the plasma treatment, wherein the thin film deposited by the first reactant can be treated to form the same materials or a different material. Repeating the above steps deposits a thick film, wherein the thickness is determined by the number of repetitions of the steps.

In another aspect, an apparatus to perform semiconductor processing includes a high density inductive coupled plasma generator to generate plasma; and a process compartment housing the plasma generator. The method can provide deposition of copper metal from Cu hfacI and plasma (gas), Cu hfacII and plasma (gas), CuI$_4$ and plasma (gas), CuCl$_4$ and plasma (gas), and organo metallic copper and plasma (gas); of titanium nitride from TDMAT and plasma (gas), TDEAT and plasma (gas), TMEAT and plasma (gas), $TiCl_4$ and plasma (gas), $TiI_4$ and plasma (gas), and organo metallic titanium and plasma (gas); of tantalum nitride from PDMAT and plasma (gas), PDEAT and plasma (gas), and organo metallic tantalum and plasma (gas); of aluminum oxide from trimethyl aluminum (TMA) and ozone, TMA and water vapor, TMA and oxygen, organo metallic aluminum and plasma (gas); and other oxides such as hafnium oxide, tantalum oxide, zirconium oxide; wherein gas is one of $N_2$, $H_2$, Ar, He, $NH_3$, and combination thereof.

Implementations of the apparatus can include gas distribution, chuck, vaporizer, pumping port to pump, and port for gas purge.

Advantages of the system may include one or more of the followings. The pump/purge step is minimized, especially with liquid precursors or reactants. There is no extensive pump/purge step to remove all first precursors or reactants before introducing second precursors or reactants, because the first and second precursors or reactants are confined in different process stations. There can be a small amount of pump/purge to minimize the amount of cross-contamination, occurring during the workpiece transfer, but this pump/purge step is significantly small and can be effectively taken care of by an isolation station. Another advantage is that the chamber cleaning step can be minimized. With the first and second precursors separated, the deposition occurring in the chamber wall is much reduced, requiring less chamber wall cleaning. This is especially useful with metal deposition using inductive coupled plasma ("ICP"), since the non-conducting window of the ICP plasma has to be cleaned of metal deposit. Another advantage is the improvement of uniformity, because a showerhead can be used in the first process station and an ICP plasma in the second process station.

Other advantages of the system may include one or more of the following. The ICP plasma can use a helical ribbon electrode instead of a coil electrode. The helical ribbon electrode provides a highly uniform plasma and also permits use of a chamber with a small volume. The system enables high precision etching, deposition, or sputtering performance. This is achieved using the pulse modulation of a RF powered plasma source, which enables tight control over the radical production ratio in plasmas, the ion temperature, and charge accumulation. Also, since accumulation of charges on a wafer occurs on the order of milli-seconds, the accumulation of charges to the wafer is suppressed by the pulse-modulated plasma which occurs on the order of microseconds. Suppression of the accumulation of charges to the wafer further minimizes damage to workpieces on the wafer caused by the charge accumulation and of notches caused during the electrode etching process. The system requires that the substrate be heated to a relatively low temperature, which can be 400° C.

The system can be used for a deposition step, such as CVD, ALD, plasma enhanced CVD, metal organic CVD (MOCVD), or sputtering deposition. The system further can be used for a treatment step, such as rapid thermal annealing, laser annealing, plasma annealing, or desorption. The system also can be used for an etching step, such as metal etch, oxide etch, or atomic layer etch. Additional stations can be added to the system. An etch station can provide an etch process to the workpiece. A plasma etch station can provide a plasma etch process to the workpiece. A deposition station can deposit a thin film on the workpiece. A sputter deposition system can sputter deposit a thin film on the workpiece. A combination of various stations, such as a sequence of deposition/etch/deposition/etch processes, can provide a multiplayer sequential process to a workpiece to enhance the conformality, or to control the properties of the film.

DESCRIPTION

Figure 1:
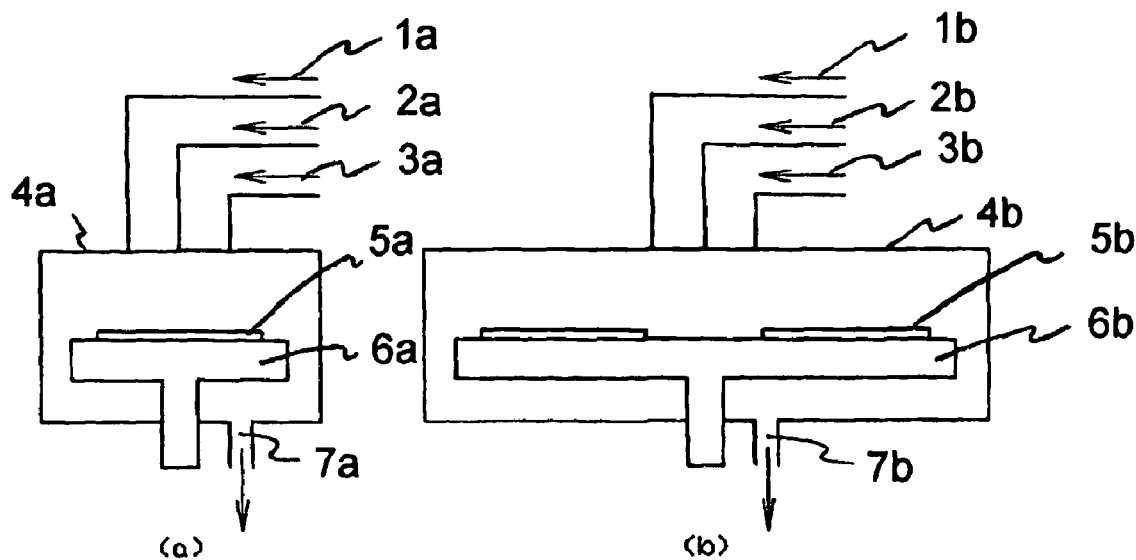
FIGS. 1a–1c show prior art sequential processing systems and method.

FIGS. 1a–1c show prior art sequential processing systems and method. FIG. 1a shows a single wafer sequential processing system such as the one used in ALD processing. A wafer 5a is positioned on a wafer support 6a inside a processing chamber 4a. The processing chamber has various inlets 1a, 2a, and 3a. Inlet 1a is for introducing the first precursor, inlet 2a is for introducing the second precursor, and inlet 3a is for introducing purge gas (a non-reactive gas such as an inert gas like helium or argon). The chamber is processed under sub-atmospheric pressure with a vacuum pump system connected to the outlet 7a. FIG. 1b shows a multiple wafer (batch) sequential processing system. The major difference between the single wafer and multiple wafer systems is the number of wafers that can be processed at one time. Multiple wafers 5b are positioned on multiple wafer supports 6b inside processing chamber 4b. The processing chamber 4b has various inlets 1b, 2b, and 3b for the first precursor, the second precursor, and the purge gas, together with a pumping outlet 7b. FIG. 1c shows a typical method of sequential processing using a prior art sequential processing system. The first precursor flows into the process chamber 4a, 4b and reacts on the wafer 5a, 5b. For the ALD technique, the first precursor is adsorbed on the wafer surface. For the NLD technique, the first precursor is deposited on the wafer surface. The purge gas then is introduced to push the first precursor out. A pumping step then follows to ensure that all of the first precursor is evacuated. Then the second precursor is introduced, and reacts on the wafer surface. The second precursor is then evacuated and then the cycle can be repeated until a desired thickness of the film is achieved. The basic operation of the prior art sequential system is the sequential introduction of the precursors.

Figure 2A:
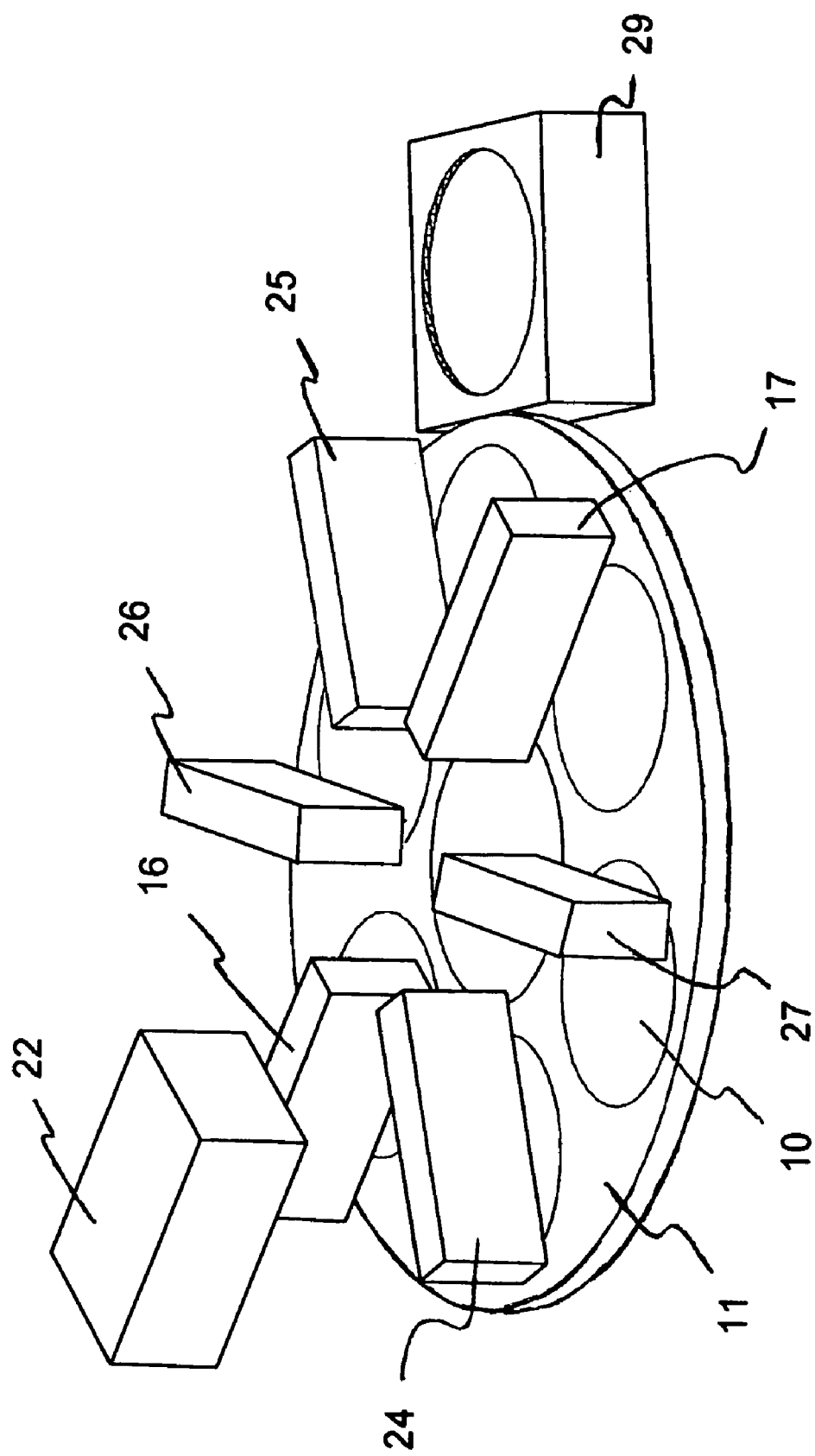
FIGS. 2a–2c show different views of an embodiment of the present invention assembly line processing system.
Figure 2B:
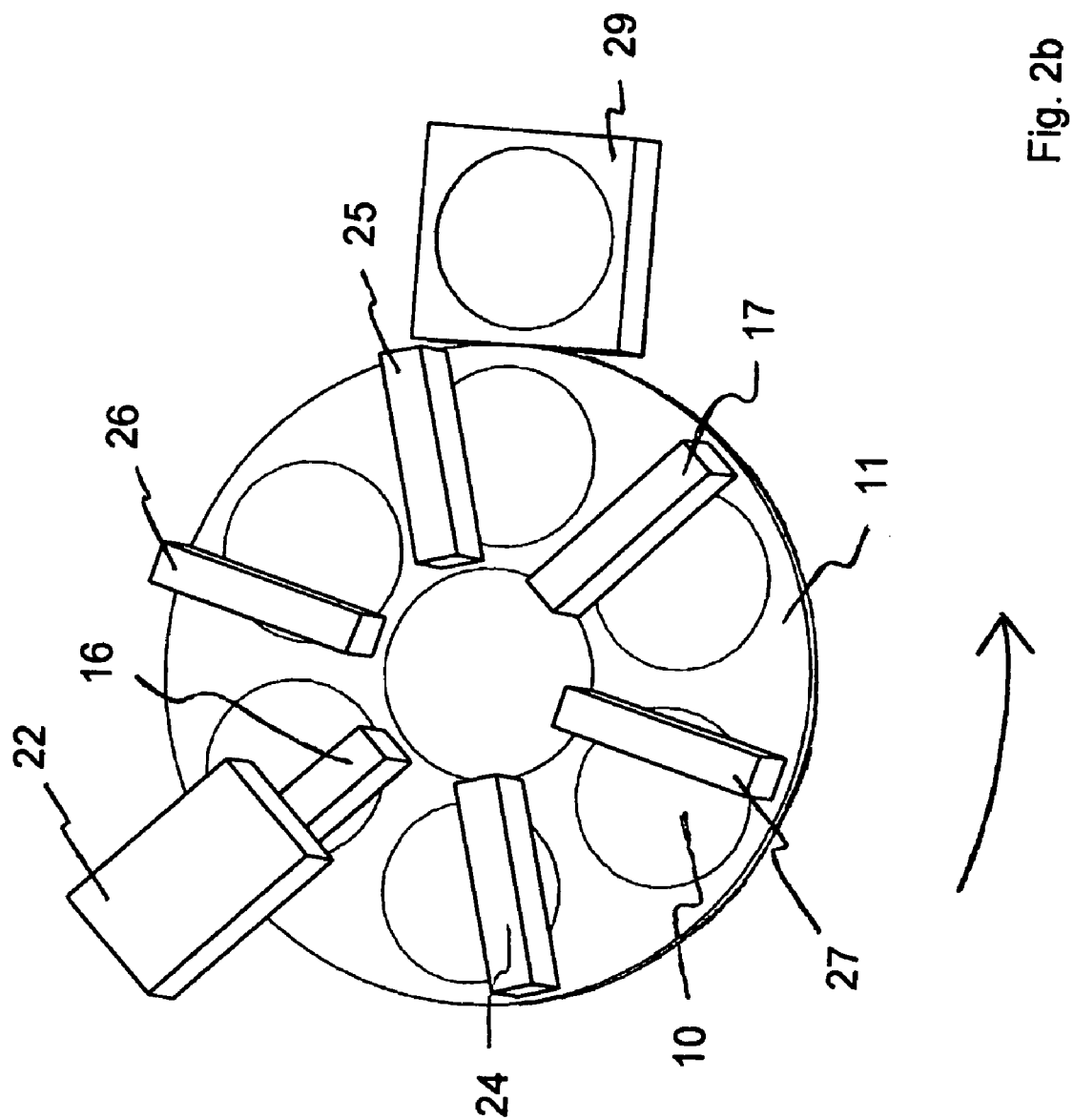
Figure 2C:
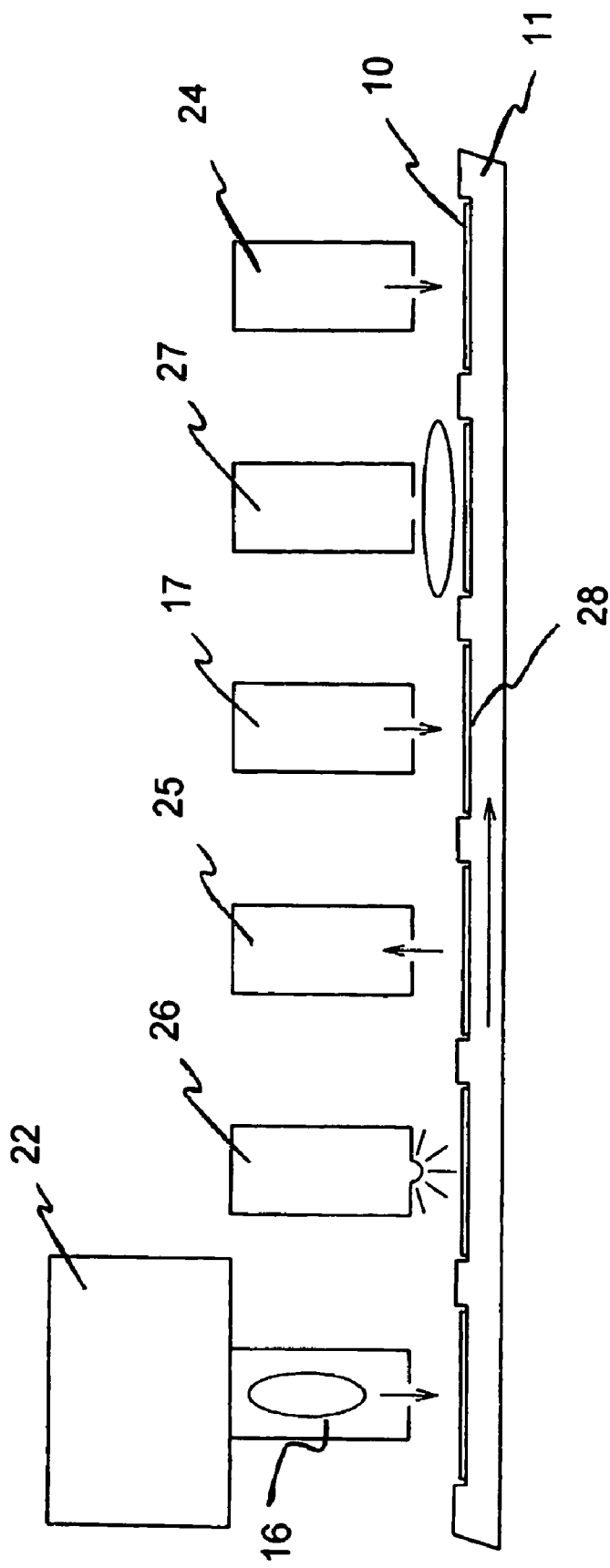
Figure 3:
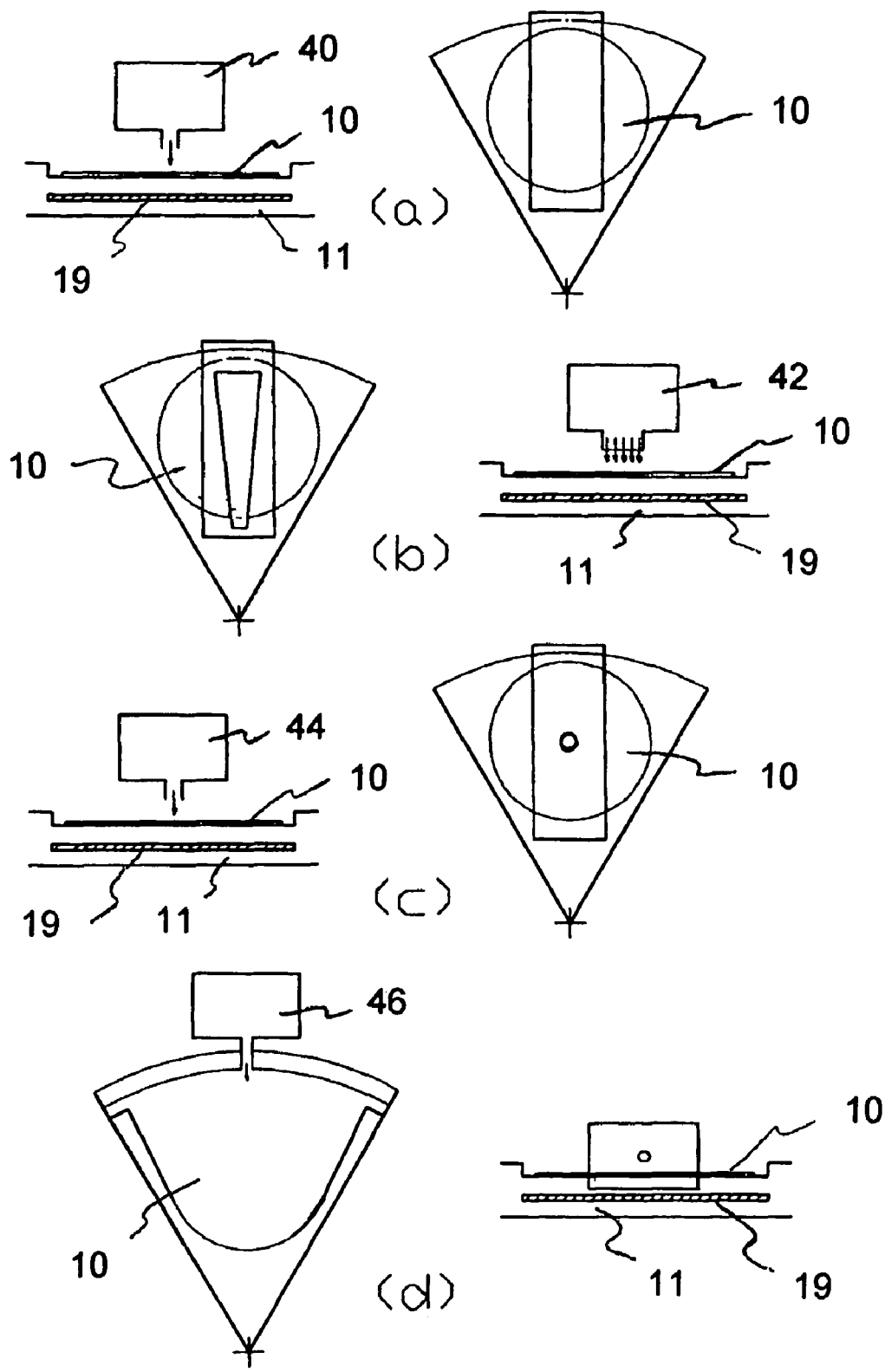
FIGS. 3a–3d show different embodiments of precursor distribution of a process station.

FIGS. 2a–2c show different views of an embodiment of the present invention assembly line processing system.

FIGS. 2a, 2b and 2c show different views of the assembly line processing system. Multiple workpieces 10, such as wafers, are positioned on a rotatable workpiece conveyor 11. Two different process stations 16 and 17 are coupled to the workpiece conveyor 11 to deliver various processes to the workpieces 10. Process station 16 further comprises a plasma generator 22 to provide energetic precursors. Two isolation stations 24 and 25 are positioned between the process stations 16 and 17 to minimize the cross contamination between the precursors of process stations 16 and 17. A heating station 26 can provide heating energy to the workpiece, and a plasma station 27 can provide plasma energy to the workpiece. The system further comprises a load-or-unload station 29 to transfer the workpieces in and out of the processing system. When the conveyor 11 is rotated around its axis, the multiple workpieces 10 are also rotated and pass through the multiple stations: the process stations 16, 17, the heating station 26, the plasma station 27 and the isolation stations 24 and 25. FIG. 2c shows a spread-out of the apparatus.

The method of operation for the present invention assembly line processing system is as follows. The first precursor is introduced to processing station 16 and the second precursor is introduced to processing station 17. The operations of plasma station 2 and heating station 26 are optional. The isolation stations 24 and 25 operate to prevent mixing of the first precursor and the second precursor Conveyor 11 rotates and the workpieces 10 are processed sequentially, first by the first precursor from processing station 16 and then by the second precursor from processing station 17. The basic operation of the present invention sequential system is the rotation of the conveyor 11. The precursor flow can be continuous, and need not be sequential as in the prior art.

FIGS. 3a–3d show different embodiments of precursor distributors of a processing station. In one embodiment (FIG. 3a), the precursor distributor is a linear injector. The processing station 40 provides precursor onto a workpiece 10. The workpiece 10 is positioned on a workpiece conveyor 11 with a embedded resistive heater 19 to heat the workpiece 10 to an elevated temperature. In another embodiment (FIG. 3b), the precursor distributor is an oblong showerhead injector. In another embodiment (FIG. 3c), the precursor distributor die is a round hole injector. In another embodiment (FIG. 3d), the precursor distributor is also a round hole injector, but delivered sideways from a processing station 46.

Figure 4:
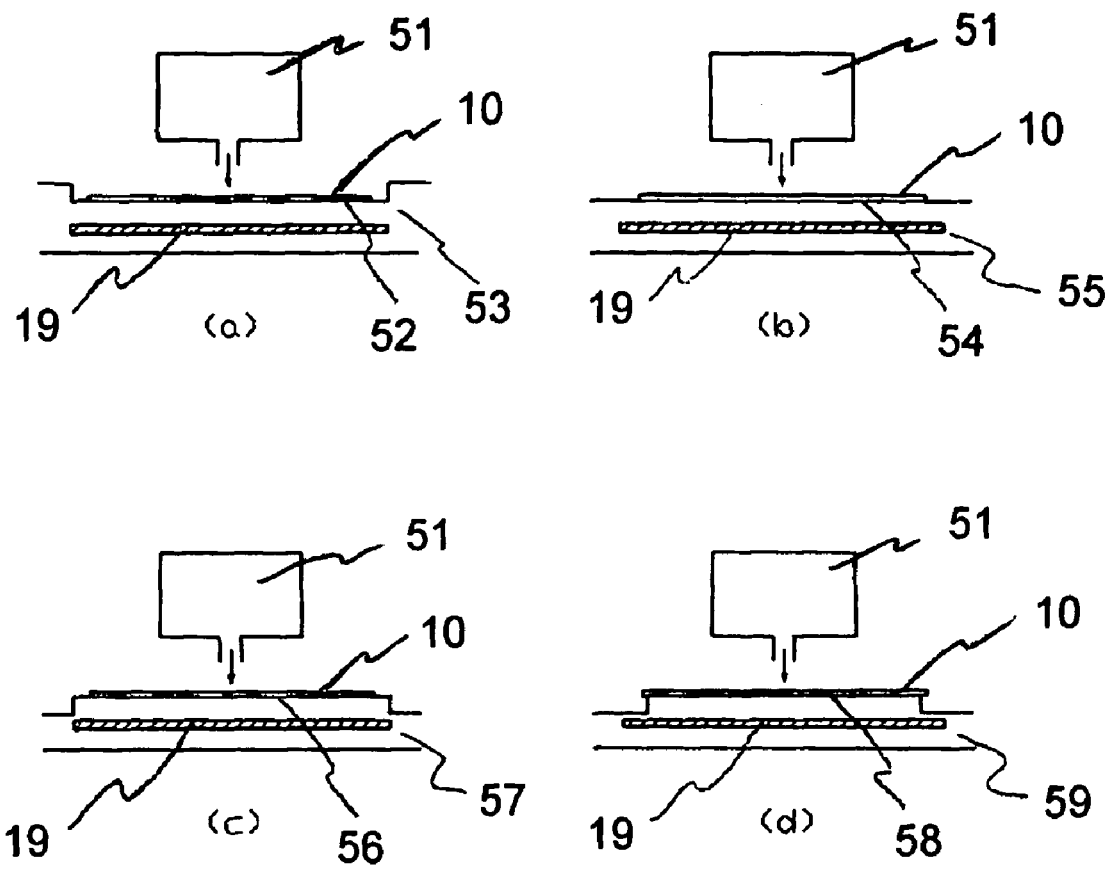
FIGS. 4a–4d show different embodiments of a workpiece support.

FIGS. 4a–4d show different embodiments of a workpiece support. FIG. 4a shows the workpiece support forming a cavity to contain the workpiece 10. The processing station 51 provides precursor to the workpiece 10. The workpiece 10 is supported by the workpiece support 52 of the conveyor 53. The conveyor 53 has an embedded resistive heater 19 to heat the workpiece to an elevated temperature. FIG. 4b shows the workpiece support 54 of the conveyor 55 having a flat surface. FIG. 4c shows the workpiece support 56 of the conveyor 57 having a recessed surface so that the workpiece 10 is raised above the conveyor 57. The workpiece support 56 is larger than the workpiece 10. FIG. 4d shows the workpiece support 58 of the conveyor 59 having a recessed surface so that the workpiece 10 is raised above the conveyor 57. The workpiece support 58 is smaller than the workpiece 10.

Figure 5A:
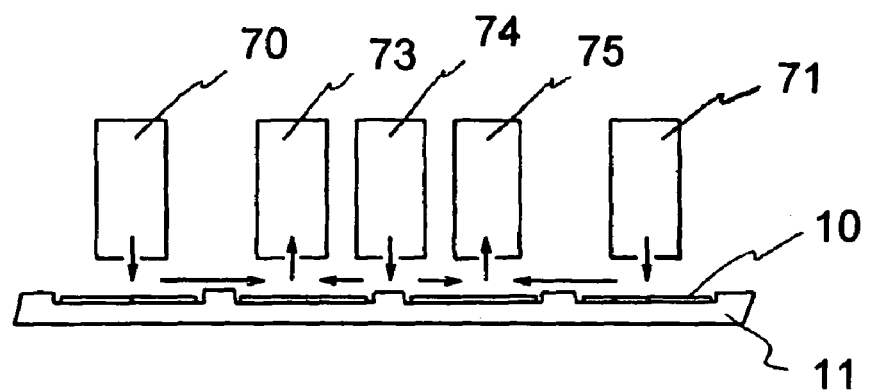
FIGS. 5a–5d show different embodiments of isolation stations.
Figure 5B:
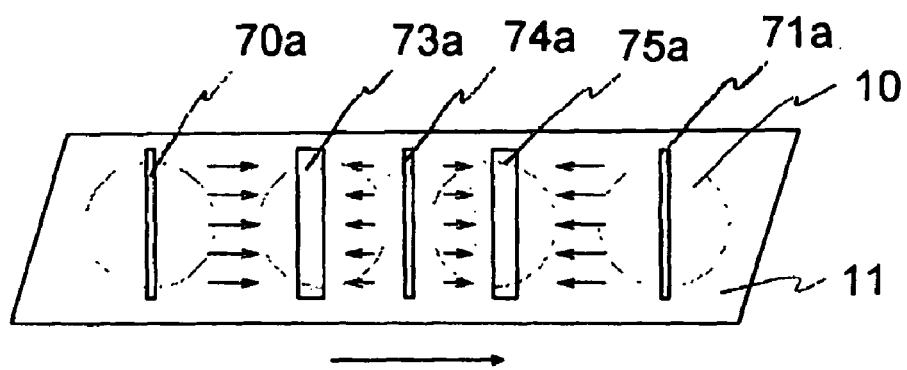
Figure 5C:
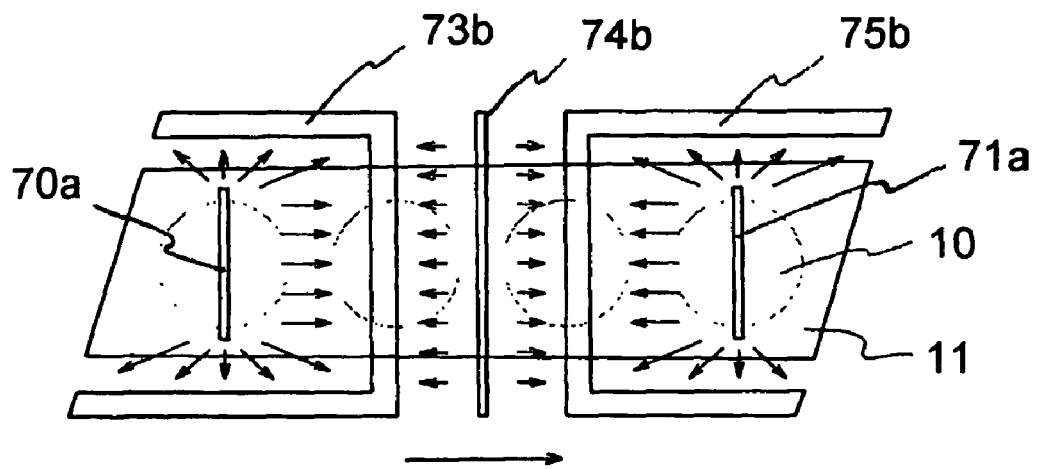
Figure 5D:
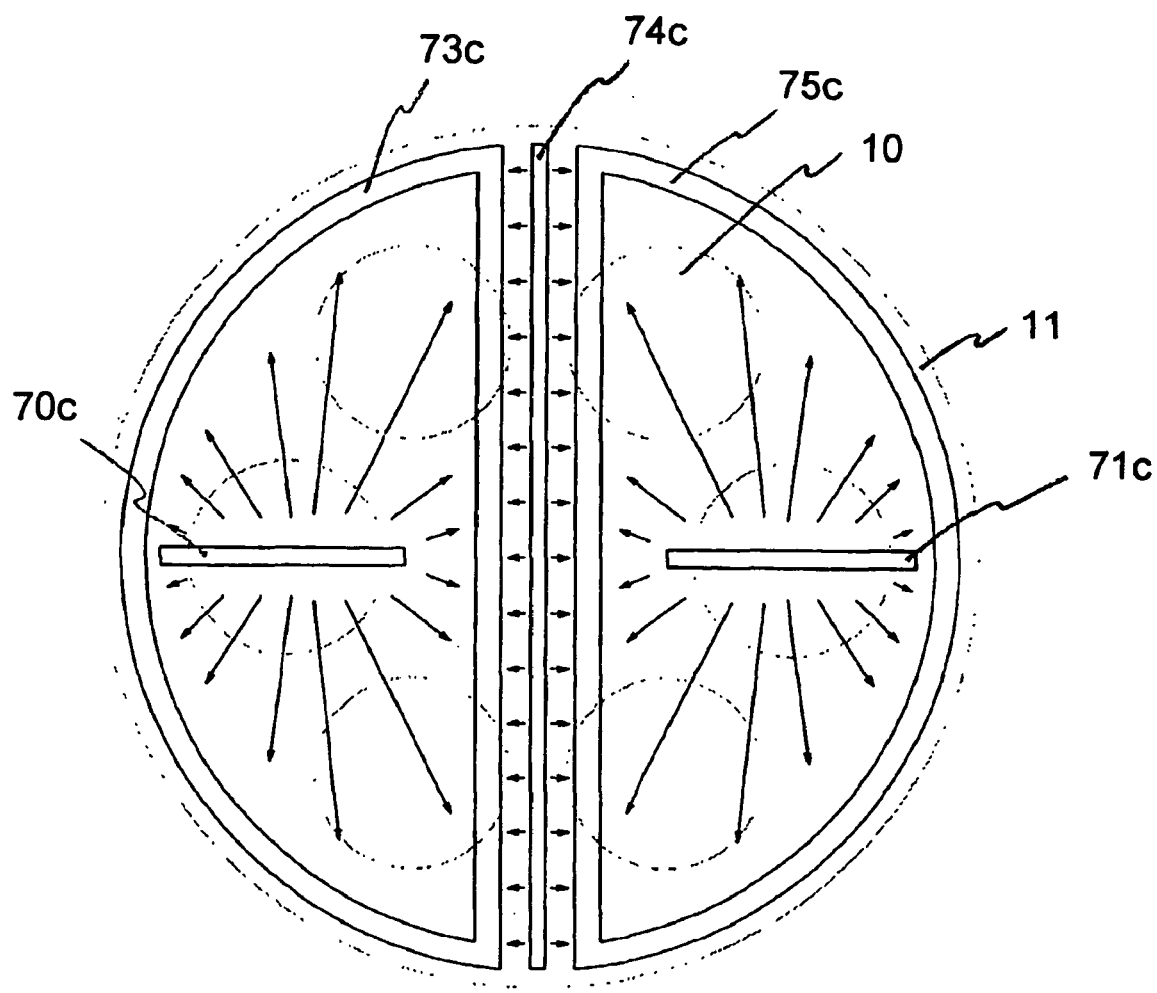

FIGS. 5a–5d show different embodiments of isolation stations. FIG. 5a shows a cross-section view of part of the apparatus. The multiple workpieces 10 are positioned on the workpiece conveyor 11 with two processing stations 70 and 71. The precursor from processing station 70 flows onto the workpiece, and then is captured by the pumping system of isolation station 73. Similarly, the precursor from processing station 71 flows onto the workpiece, and then is captured by the pumping system of isolation station 75. The purging system of isolation station 74 creates a gas curtain to prevent cross flow of precursors from processing stations 70 and 71. FIG. 5b is a top view of the isolation station. The precursor distributors of processing stations 70a and 71a are linear injectors to the workpiece 10 on the conveyor 11. The purge system of isolation station 74a creates a gas flow toward the both the pumping systems of the isolation stations 73a and 75a to prevent the precursor from processing station 70a from reacting with the precursor from processing station 71a. FIG. 5c is another embodiment of the isolation station where the pumping systems of isolation stations 73b and 75b cover completely processing stations 70a and 71a. The purging system of isolation station 74b keeps the precursors from processing stations 70a and 71a apart. FIG. 5d is another embodiment of the isolation station where the pumping systems of isolation stations 73c and 75c cover completely the processing stations 70c and 71c. Conveyor 11 in FIG. 5d is a rotatable platform, and can carry six workpieces 10. The purging system of isolation station 74c keeps the precursors from processing stations 70c and 71c apart.

Figure 6:
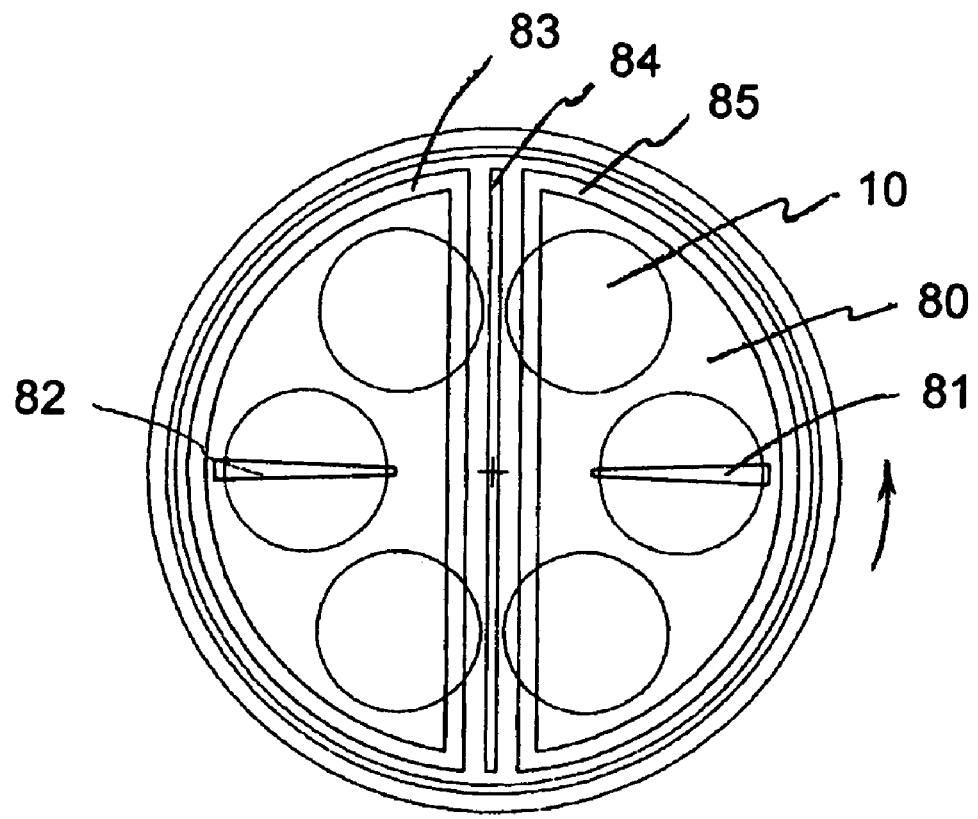
FIGS. 6a–6b show different views of an embodiment of the present invention assembly line processing system using sub-atmospheric pressure processing.
Figure 6:
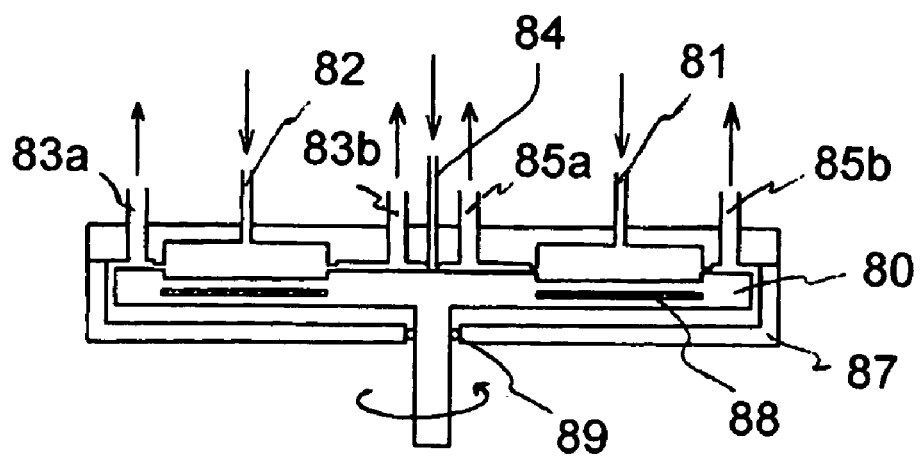

FIGS. 6a–6b show different views of an embodiment of the present invention assembly line processing system using sub-atmospheric pressure processing. The rotatable conveyor 80 can carry six workpieces 10 which can be arranged in a circle. There are two process stations 81 and 82 to provide precursors to the workpieces 10. The pumping systems of the isolation stations 83, 83a, 83b, 85, 85a, and 85b cover completely processing stations 81 and 82. The purging system of isolation station 84 creates a gas curtain to further separate the precursors from processing stations 81 and 82. The system further comprises a lower section 87 to maintain sub-atmospheric pressure inside the chamber. The conveyor 80 also has multiple heaters 88 embedded to the workpiece support to heat the workpieces 10. The conveyor 80 is rotatable and has a sealable rotatable bearing 89 (such as a ferrofluidic seal).

Figure 7:
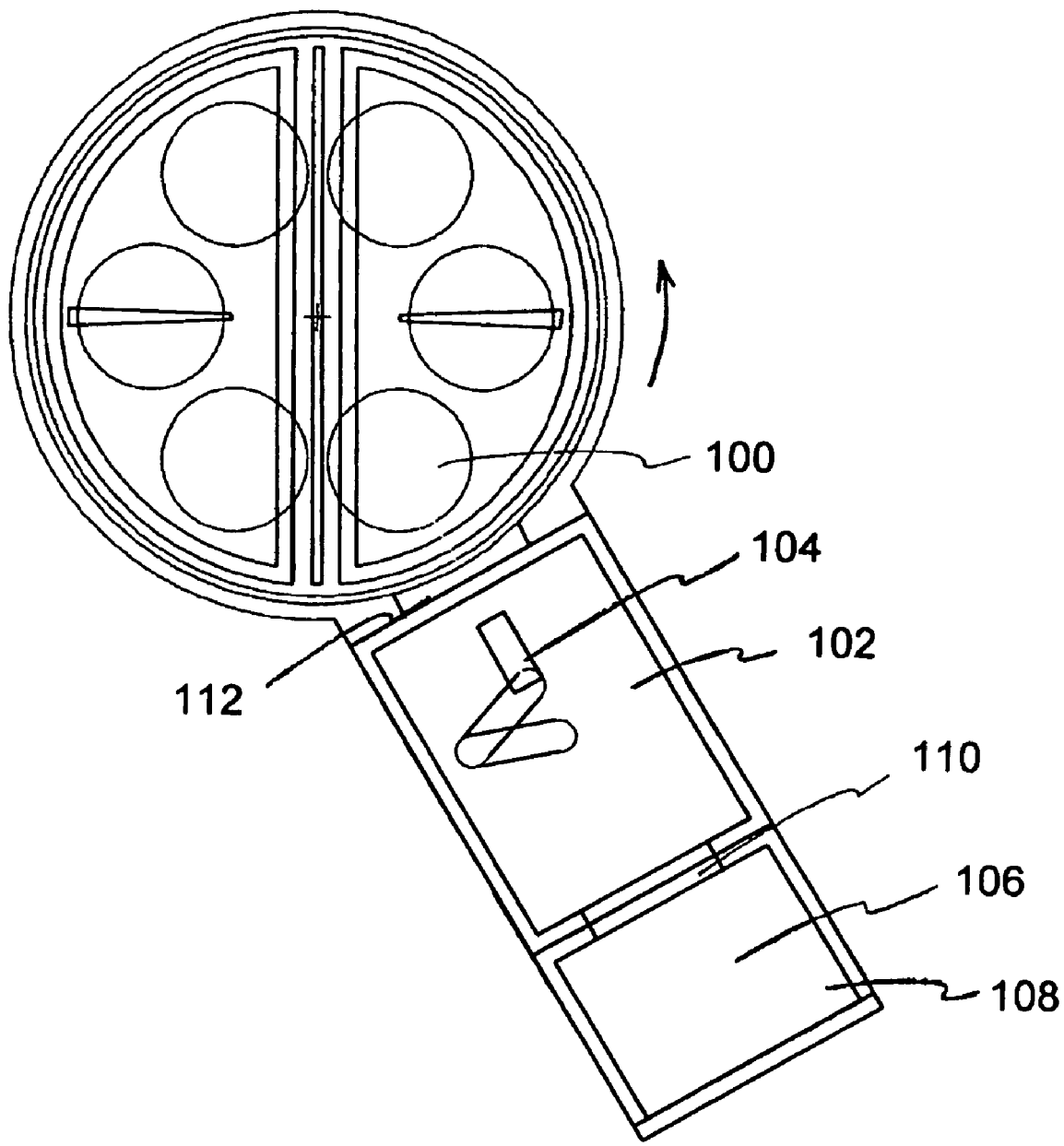
FIG. 7 shows an embodiment of the present invention assembly line processing system using a load-or-unload station.

FIG. 7 shows an embodiment of the present invention assembly line processing system using a load-or-unload station. The load-or-unload station comprises a transfer arm 104 in a transfer housing 102. The transfer arm 104 can load or unload a workpiece 100 from the process chamber to the transfer housing 102 through an opening 112 in the transfer housing 102. The workpiece 100 then can be loaded or unloaded to a storage 108 through an opening 110 of the storage 108. The storage 108 can store a number 106 of workpieces 100.

Figure 8:
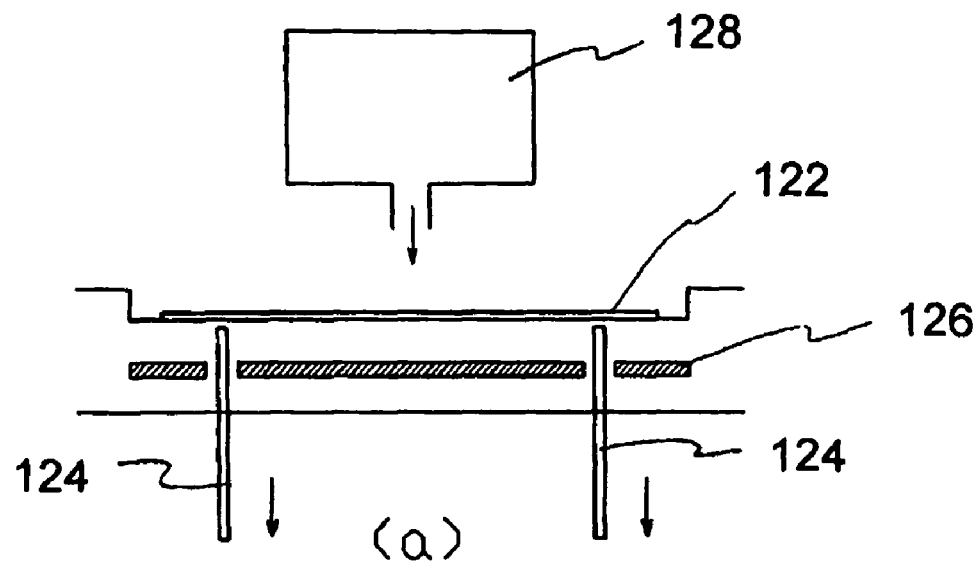
FIGS. 8a–8b show different views of an embodiment of the present invention assembly line processing system using workpiece lift.
Figure 8:
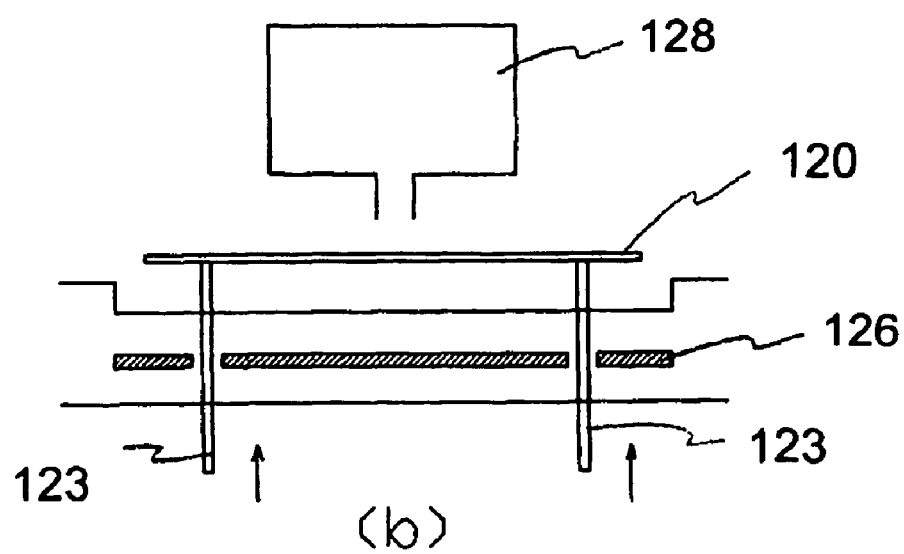

FIGS. 8a–8b show different views of an embodiment of the present invention assembly line processing system using workpiece lifts. FIG. 8a shows the workpiece 122 in processing station 128 while the processing station 128 is delivering a precursor to the workpiece 122. The embedded heater 126 to heat the workpiece 122 comprises multiple openings for the insertion of the workpiece lifts 124. FIG. 8b shows workpiece 120 in the up position, ready to be unloaded to the storage. The workpiece lifts 123 are in up position, which raises the workpiece 120 up. The process station 128 is not operational when the workpiece lifts 123 are in the up position and the workpiece 120 is raised, since the workpiece 120 is ready to be unloaded.

Figure 9:
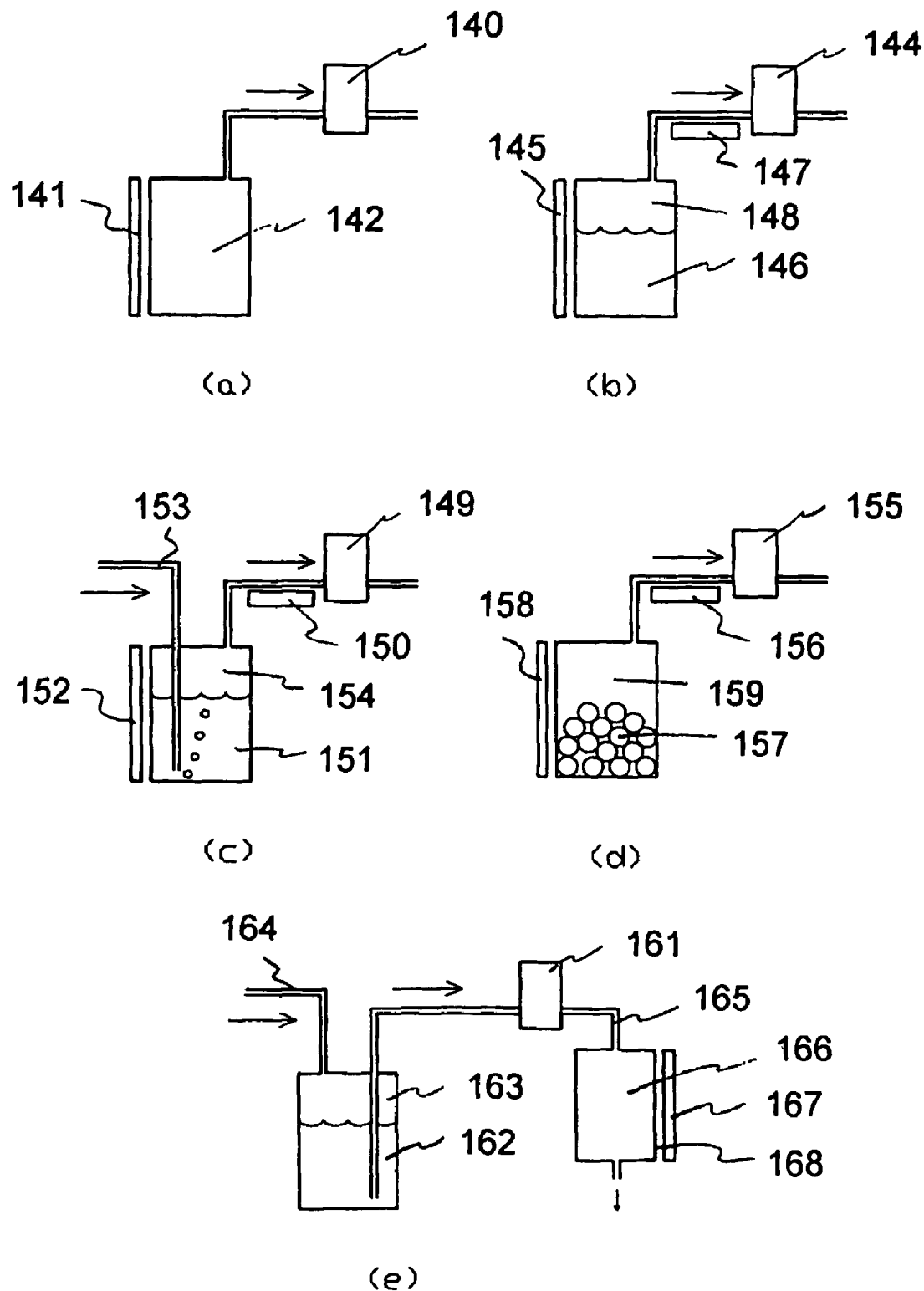
FIGS. 9a–9e show different embodiments of precursor delivery systems.

FIGS. 9a–9e show different embodiments of precursor delivery systems. FIG. 9a shows a gaseous precursor delivery system. The gaseous precursor 142 is delivered through the metering device 140 to the workpiece. The heater 141 is used to keep the gaseous precursor at a desired temperature. Typically, the gaseous precursor 142 is kept at a high pressure. FIG. 9b shows a vapor draw liquid precursor delivery system. The precursor is in equilibrium in liquid form 146 and in vapor form 148. The vapor form 148 is drawn to a metering device 144 to the workpiece. A first heater 145 heats the liquid precursor 146 to raise the partial pressure of the precursor vapor 148. A second heater 147 prevents condensation of the vapor in the delivery line. FIG. 9c shows a bubbler liquid delivery system. The precursor is in equilibrium in liquid form 151 and in vapor form 154. A carrier gas 153 is bubbled through the liquid precursor 151 and carries the precursor vapor 154 through a metering device 149 to the workpiece. A first heater 152 heats the liquid precursor 151 to raise the partial pressure of the precursor vapor 154. A second heater 150 prevents condensation of the vapor in the delivery line. FIG. 9d shows a vapor draw solid precursor delivery system. The precursor is in equilibrium in solid form 157 and in vapor form 159. The vapor form 159 is drawn to a metering device 155 and to the workpiece. A first heater 158 heats the solid precursor 157 to raise the partial pressure of the precursor vapor 159. A second heater 156 prevents condensation of the vapor in the delivery line. FIG. 9e shows a liquid injection delivery system. A non-reactive gas 164 exerts pressure 163 on the liquid precursor 162 to push the liquid precursor to a metering device 161. The liquid precursor 165 then travels to a vaporizer 168 to be converted to vapor form 166. A heater 167 heats the vaporizer to supply energy to the liquid precursor to convert to vapor form.

Figures 10A, 10B:
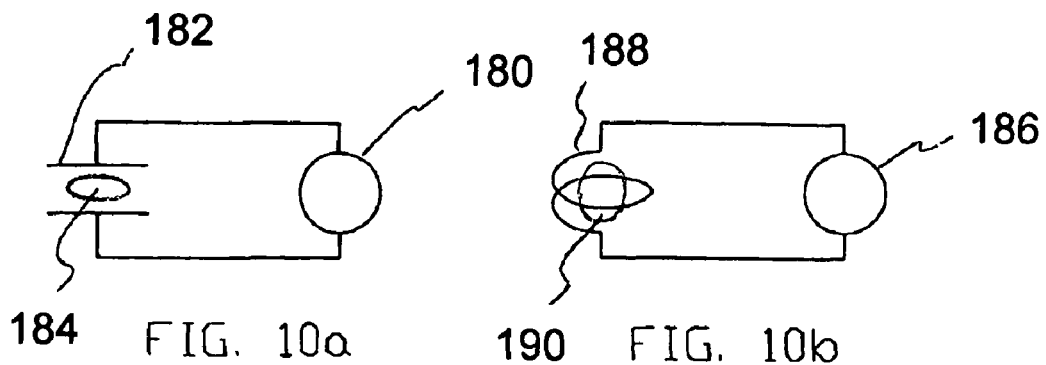
FIGS. 10a–10c show different embodiments of plasma generators.
Figure 10C:
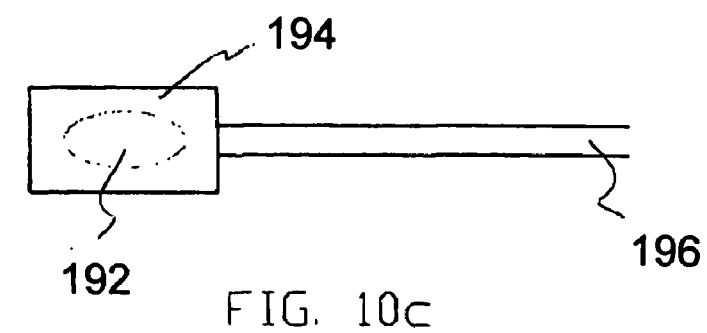

FIGS. 10a–10c show different embodiments of plasma generators. FIG. 10a shows a parallel plate plasma generator. A power source 180 supplies power to a pair of parallel plates 182, generates a high electric field between the parallel plates 182, and excites the gas between the parallel plates 182 to generate a plasma 184. This plasma 184 is highly directional because of the electric field, and has a low density. FIG. 10b shows an ICP. A power source 186 supplies power to an inductive coil 188, generates a high magnetic field inside the coil 188, and excites the gas inside the coil 188 to generate a plasma 190. This plasma is not directional and has a high ion density. FIG. 10c shows a remote plasma system. The plasma generator 194 generates a plasma 192 upstream of the flow and carries the excited and energetic species downstream 196. This plasma has little kinetic energy and a fairly uniform distribution of energy. Plasma can be generated by a power source with RF (RF) such as a parallel plate plasma, remote plasma, or microwave frequency ("MW") such as a remote plasma or a microwave plasma.

Figure 11:
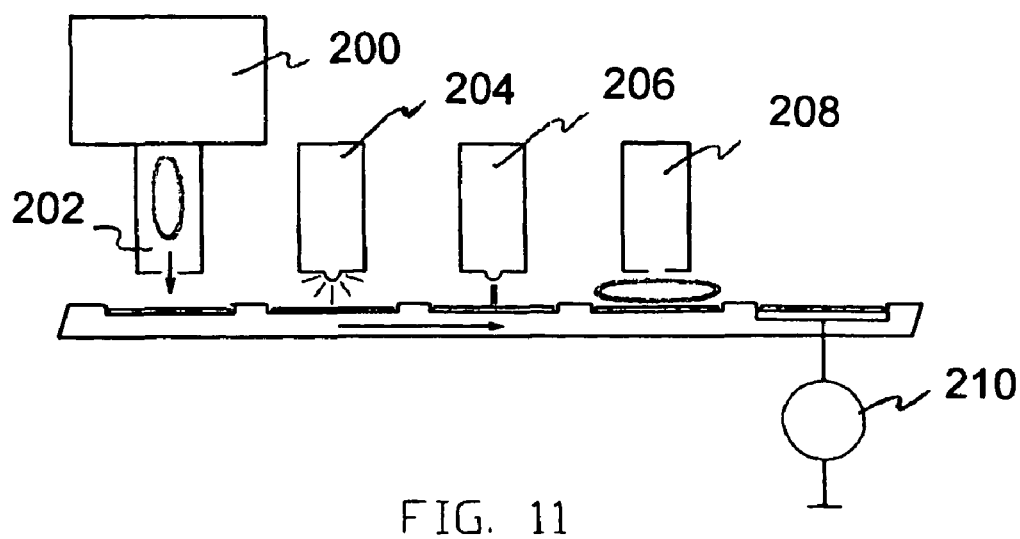
FIG. 11 shows an embodiments of various stations.

FIG. 11 shows an embodiments of various stations. The first station is a plasma process station 202. The processing station 202 has a plasma generator 200 to excite the precursor before deliver to the workpiece. The second station is a heating station 204. The heating station 204 delivers thermal energy and photon energy to the workpiece for heating and for reaction acceleration. The third station is a laser station 206. The laser station 206 delivers laser energy to the workpiece for heating and for reaction acceleration. The fourth station is a plasma station 208. The plasma station 208 delivers plasma energy to the workpiece. A bias source 210 is also shown for biasing the workpiece for directional control of the charged species.

What is claimed is:

1. A method of sequentially processing a plurality of workpieces, the method comprising:

determining for the plurality of workpieces a sequential processing cycle including at least at two differing processing steps, said differing processing steps occurring at least two different processing stations arranged in a closed-loop path within an enclosed chamber, said different processing stations delivering at least one different precursor to the workpiece;

processing the workpieces sequentially at each of the different processing stations, wherein a workpiece conveyor supports the workpieces during processing and transports the workpieces between the different processing stations;

isolating the different processing stations with an isolation station positioned between the different processing stations, the isolating step comprising purging with a non-reactive gas between the different processing stations wherein the purging non-reactive gas is introduced through an introduction port located between two exhaust pumping stations, said exhaust pumping stations exhausting the precursors from the different processing stations through exhaust ports and wherein the introduction port of the isolation station protrudes close to a plane that contains the workpiece than the exhaust ports to restrict the communication between the different processing stations to minimize gas phase reaction of the precursors from the different processing stations; and repeating the processing and isolating steps until a desired film is on the workpieces.

2. The method as in claim 1 further comprising the step of heating the workpieces with workpiece heaters coupled to a plurality of workpiece supports that support the plurality of workpieces.

3. The method as in claim 1 wherein the workpiece comprises a top processing surface, and the processing steps further comprise delivering the precursors from above and substantial parallel to the top surface.

4. The method as in claim 1 wherein the workpiece comprises a top processing surface, and the processing steps further comprise delivering the precursors from over the top of the workpieces.

5. The method as in claim 1 wherein the isolating step further comprises pumping to minimize gas phase reaction of the precursors from the different processing stations.

6. The method as in claim 1 wherein the purging gas comprises creating a gas curtain between the different processing stations.

7. The method as in claim 1 wherein the processing stations and the isolations are sub-atmospheric.

8. The method as in claim 1 further comprising heating the plurality of workpieces at a plurality of heating stations.

9. The method as in claim 1 wherein the method further comprises delivering the precursors to the workpiece with a gas delivery system, a liquid precursor delivery system, or a solid precursor delivery system.

10. The method as in claim 1 wherein at least one processing step is a deposition step.

11. The method as in claim 10 wherein the deposition step is one of chemical vapor deposition (CVD), atomic layer deposition (ALD), plasma enhanced chemical vapor deposition (PECVD), metalorganic chemical vapor deposition (MOCVD), nanolayer deposition (NLD), and sputtering deposition.

12. The method as in claim 1 wherein at least one processing step is a treatment step, wherein an existing thin film on the workpiece is treated.

13. The method as in claim 12 wherein the treatment is one of thermal annealing, rapid thermal annealing, laser annealing, and plasma exposure.

14. The method as in claim 1 wherein at least one processing step is an etching step to etch an existing thin film on the workpiece.

15. The method as in claim 14 wherein the etching step is one of metal etching, oxide etching, atomic layer etching, and plasma etching.

16. A method of sequentially processing a plurality of workpieces, the method comprising:
   determining for the plurality of workpieces a sequential processing cycle including at least a thin film deposition step in a deposition station and a thin film treatment step in a treatment station, said different processing stations arranged in a closed-loop path within an enclosed chamber;
   processing the workpieces sequentially at each of the different processing stations, wherein a workpiece conveyor supports the workpieces during processing and transports the workpieces between the different processing stations;
   isolating the different processing stations with an isolation station positioned between the different processing stations, the isolating step comprising purging with a non-reactive gas between the different processing stations
   wherein the purging non-reactive gas is introduced through an introduction port located between two exhaust pumping stations, said exhaust pumping stations exhausting the precursors from the different processing stations through exhaust ports and wherein the introduction port of the isolation station protrudes closer to a plane that contains the workpiece than the exhaust ports to restrict the communication between the different processing stations to minimize gas phase reaction of the precursors from the different processing stations; and
   repeating the processing and isolating steps until a desired film is on the workpieces.

17. The method as in claim 16 wherein the isolating step further comprises pumping to minimize gas phase reaction of the precursors from the different processing stations.

18. The method as in claim 16 wherein the purging gas comprises creating a gas curtain between the different processing stations.

19. The method as in claim 16 wherein the processing stations and the isolations are sub-atmospheric.

20. The method as in claim 16 further comprising heating the plurality of workpieces at a plurality of heating stations.

21. The method as in claim 16 wherein the deposition step is one of chemical vapor deposition (CVD), atomic layer deposition (ALD), plasma enhanced chemical vapor deposition (PECVD), metalorganic chemical vapor deposition (MOCVD), nanolayer deposition (NLD), and sputtering deposition.

22. The method as in claim 16 wherein the treatment is one of thermal annealing, rapid thermal annealing, laser annealing, and plasma exposure.

23. A method of sequentially processing a plurality of workpieces, the method comprising:
   determining for the plurality of workpieces a sequential processing cycle including at least a thin film deposition step in a deposition station and a thin film etching step in an etching station, said different processing stations arranged in a closed-loop path within an enclosed chamber;
   processing the workpieces sequentially at each of the different processing stations, wherein a workpiece conveyor supports the workpieces during processing and transports the workpieces between the different processing stations;
   isolating the different processing stations with an isolation station positioned between the different processing stations, the isolating step comprising purging with a non-reactive gas between the different processing stations
   wherein the purging non-reactive gas is introduced through an introduction port located between two exhaust pumping stations, said exhaust pumping stations exhausting the precursors from the different processing stations through exhaust ports and
   wherein the introduction port of the isolation station protrudes closer to a plane that contains the workpiece than the exhaust ports to restrict the communication between the different processing stations to minimize gas phase reaction of the precursors from the different processing stations; and
   repeating the processing and isolating steps until a desired film is on the workpieces.

24. The method as in claim 23 wherein the etching step is one of metal etching, oxide etching, atomic layer etching, and plasma etching.

25. The method as in claim 23 wherein the isolating step further comprises pumping to minimize gas phase reaction of the precursors from the different processing stations.

26. The method as in claim 23 wherein the purging gas comprises creating a gas curtain between the different processing stations.

27. The method as in claim 23 wherein the processing stations and the isolations are sub-atmospheric.

* * * * *

UNITED STATES PATENT AND TRADEMARK OFFICE
CERTIFICATE OF CORRECTION

PATENT NO. : 7,153,542 B2  Page 1 of 1
APPLICATION NO. : 10/212546
DATED : December 26, 2006
INVENTOR(S) : Tue Nguyen, Tai Dung Nguyen and Craig Alan Bercaw It is certified that error appears in the above-identified patent and that said Letters Patent is hereby corrected as shown below:

Column 16, Claim 1
Line 24, after "protrudes", delete "close" and insert --closer--.

Signed and Sealed this

Fourth Day of September, 2007

JON W. DUDAS
*Director of the United States Patent and Trademark Office*